US008332696B2

(12) United States Patent
Zeng (10) Patent No.: US 8,332,696 B2
(45) Date of Patent: Dec. 11, 2012

(54) DEFECT MANAGEMENT METHOD FOR STORAGE MEDIUM AND SYSTEM THEREOF

(75) Inventor: Wen-Jun Zeng, Keelung (TW)

(73) Assignee: Industrial Technology Research Institute, Hsinchu (TW)

( * ) Notice: Subject to any disclaimer, the term of this patent is extended or adjusted under 35 U.S.C. 154(b) by 1172 days.

(21) Appl. No.: 11/965,682

(22) Filed: Dec. 27, 2007

(65) Prior Publication Data

US 2009/0044085 A1 Feb. 12, 2009

(30) Foreign Application Priority Data

Aug. 6, 2007 (TW) .............................. 96128826 A (51) Int. Cl.
G11C 29/00 (2006.01)
(52) U.S. Cl. ...................................................... 714/723
(58) Field of Classification Search ................... 714/723
See application file for complete search history.

(56) References Cited

U.S. PATENT DOCUMENTS

| | | | | |
|---|---|---|---|---|
| 5,222,109 A * | 6/1993 | Pricer | ........................... | 377/24.1 |
| 6,058,047 A * | 5/2000 | Kikuchi | ................... | 365/185.33 |
| 6,662,263 B1 * | 12/2003 | Wong | ............................. | 711/103 |
| 6,850,443 B2 * | 2/2005 | Lofgren et al. | .......... | 365/185.29 |
| 7,137,027 B2 * | 11/2006 | Shiota et al. | ..................... | 714/5.1 |
| 7,245,556 B1 * | 7/2007 | Pinto et al. | ..................... | 365/236 |
| 7,269,708 B2 * | 9/2007 | Ware | ............................. | 711/203 |
| 7,277,011 B2 * | 10/2007 | Estakhri | ........................ | 340/540 |
| 7,299,316 B2 * | 11/2007 | Chou et al. | ..................... | 711/103 |
| 7,318,117 B2 * | 1/2008 | Lee et al. | ..................... | 711/103 |
| 7,409,492 B2 * | 8/2008 | Tanaka et al. | ................. | 711/103 |
| 7,567,461 B2 * | 7/2009 | Roohparvar | ............. | 365/185.19 |
| 7,568,075 B2 * | 7/2009 | Fujibayashi et al. | .......... | 711/154 |
| 7,653,778 B2 * | 1/2010 | Merry et al. | .................. | 711/103 |
| 7,664,987 B2 * | 2/2010 | Bychkov et al. | ................ | 714/30 |
| 7,904,637 B2 * | 3/2011 | Entani | ........................... | 711/103 |
| 2005/0204187 A1 * | 9/2005 | Lee et al. | .......................... | 714/8 |
| 2009/0199056 A1 * | 8/2009 | Murata | ........................ | 714/704 |

* cited by examiner

Primary Examiner — James C Kerveros
(74) Attorney, Agent, or Firm — Jianq Chyun IP Office (57) ABSTRACT

A defect management method for a storage medium is provided. An initial check is performed on the storage medium, and then diving the storage medium into blocks, which at least include a using data area with endurance blocks. Each endurance block is given an initial endurance value. Then, an endurance table is established in the storage medium for recording endurance blocks and the initial endurance values. According to the endurance table, data is written to the storage medium based on its importance. When the writing cycles reach a predetermined times, the endurance values are recalculated and the table is updated accordingly. Data is then moved according to the new endurance values.

18 Claims, 6 Drawing Sheets

| TIMES | ECC | Endu |
|---|---|---|
| 0-9999 | 0 | 0 |
| 0-19999 | 0-2 | 1 |
| 0-49999 | 0-4 | 2 |
| 0-Max | NO DEFECT | 3 |

DEFECT MANAGEMENT METHOD FOR STORAGE MEDIUM AND SYSTEM THEREOF

CROSS-REFERENCE TO RELATED APPLICATION

This application claims the priority benefit of Taiwan application serial no. 96128826, filed on Aug. 6, 2007. The entirety of the above-mentioned patent application is hereby incorporated by reference herein and made a part of this specification.

BACKGROUND OF THE INVENTION

1. Field of the Invention

The present invention generally relates to a defect management method for a storage medium and a system thereof. In particular, the present invention relates to a defect management method for a memory and a system thereof.

2. Description of Related Art

The data recording function of a storage medium, especially a non-volatile memory such as a flash memory, starts to deteriorate after the storage medium has been written and erased for above predetermined times due to the tunneling effect of semiconductors. To resolve foregoing problem, error correction codes (ECCs) are used in data blocks of a memory for data corrections. Additionally, defect management, software management, or endurance management has also been adopted for managing or correcting defective data in a memory. However, each of these methods has its disadvantage.

According to the ECC method, another management mechanism has to be adopted when the error can not be corrected. Thus, a potential defect data block cannot be effectively predicted and accordingly the defect cannot be prevented in advance. According to the defect management method, the defect is not predicted or prevented in advance; instead, a defective block is just marked and managed. However, in the defect management method, data may be damaged in a new defective block.

According to the software management method, a flash memory for management is embedded in an operating system or application software. However, the storage medium of such method cannot be portable, and when the operating system or application software is re-installed, the management data will be lost. In addition, an endurance management is to manage the memory usage based on a counting manner.

In addition, the endurance management is a counting management method. This method utilizes writing times as a mechanism for damage prevention. This method will waste many data blocks that are marked as defective blocks before any defect occurs therein. In addition, the endurance management is not applicable to data blocks whose damage is caused by non-writing operations, for example, the data block is read many times or left idle for very long time.

Accordingly, a method for effectively managing defective data blocks and preventing defects in advance is required.

SUMMARY OF THE INVENTION

Accordingly, the present invention is to provide a method for effectively preventing defects and managing different defective data blocks. Important data can be protected before data is damaged and a defect caused by erasing/writing or reading a data block too many times or leaving the data block idle for a long time can be prevented. In this manner, data blocks starting having damages can be effectively used and managed.

The present invention provides a defect management method for a storage medium. The defect management method includes following steps. First, an initial check is performed to the storage medium, and then the storage medium is divided into a plurality of areas. The areas comprise at least a use data area having a plurality of endurance blocks. Each endurance block in the use data area is applied an initial endurance value. An endurance table is established in the storage medium for recording the endurance blocks and the initial endurance values. An erase/write operation is performed to the storage medium according to the endurance table. The endurance values of the endurance blocks are recalculated and the endurance table is updated accordingly when the storage medium has been erased/written a predetermined erase/write number. A read operation is performed to the storage medium. The endurance values of the endurance blocks are recalculated and the endurance table is updated accordingly when the storage medium has been read a predetermined read number.

The present invention further provides a defect management system for a storage medium. The defect management system includes a storage area, a space manager, an error correction code (ECC) unit, a micro controller, and an endurance table. The storage area includes a plurality of endurance blocks. The space manager is coupled to the storage area for managing the storage area. The ECC unit is coupled to the storage area and the space manager, and the ECC unit performs an ECC detection and correction when an erase/write operation or a read operation is performed to the storage area. The micro controller is coupled to the space manager and executes the defect management method. The endurance table records the endurance values of the endurance blocks.

As described above, in the present invention, a memory (for example, a flash memory) is managed through counting and ECC detection and correction. In addition, data files stored in the memory are categorized according to the their importance, and then the data/files of lower importance are stored in data blocks with higher defect prediction factors so that the reliability of the data stored in the memory can be increased and the storage space of the memory can be sufficiently utilized.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Before describing the defect management method and system thereof for a storage medium provided by the present invention, the data structure of the storage medium will be explained herein. Only related information of the data structure is described herein; however, the complete data structure may further include other information in actual applications.

Figure 1:
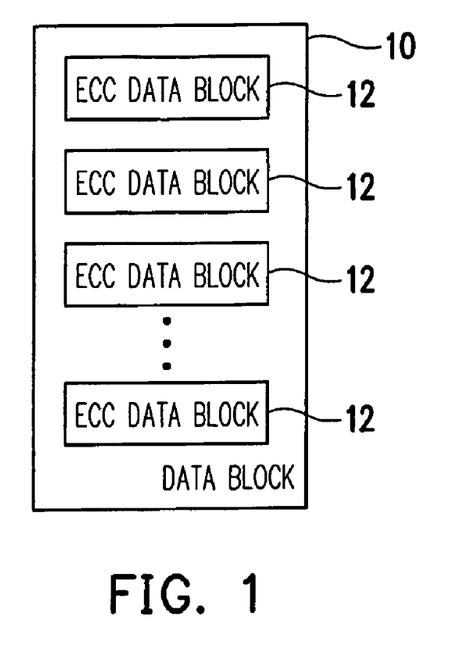
FIG. 1 is a diagram of a data block having a plurality of ECC units.

FIG. 1 is a schematic a diagram showing a data block having a plurality of ECC units. A flash memory will be described as an example in following embodiments. The data block 10 illustrated in FIG. 1 is a basic read/write unit in the flash memory. The data block 10 comprises one or plural ECC data blocks 12. The size of the data block 10 can be 512 B or 2 KB, and this size can also be adjusted appropriately according to the actual design requirement. Each ECC data block 12 contains data indicating error-correctible bit number, for example, 16 bits. An error correction process can be performed by using the ECC data blocks 12 to data to be read from or written into the flash memory.

Each ECC data block 12 has its own detectible error bit number and correctible error bit number. In addition, each data block 10 also has its own detectible error bit number and correctible error bit number. Namely, in the data block 10, the total number of detectible error bits is a sum of detectible error bit numbers of all ECC data blocks, and the total number of correctible error bits is a sum of correctible error bit numbers of all ECC data blocks 12.

Figure 2:
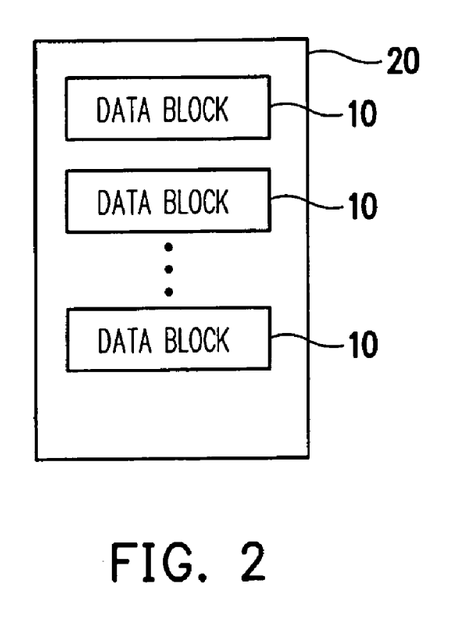
FIG. 2 is a diagram of an endurance block according to one embodiment of the present invention.

FIG. 2 is a schematic diagram of an endurance block according to one embodiment of the present invention. Referring to FIG. 2, in the present embodiment, the endurance block 20 in the flash memory can comprise a plurality of data blocks 10 illustrated in FIG. 1. The endurance block is used as a basic unit for recording and calculating a damage degree in the flash memory.

According to the embodiment, the data/files stored in the flash memory are categorized according to their importance, and a specific endurance value Endu is given to each endurance block 20; namely, a reference tag is attached to each storage area in the flash memory to present a damage degree, so that the system can predict the endurance of the storage area. For example, a storage area can be given an endurance value 0, 1, 2, or 3 according to a degree of data to be error. The smaller the Endu value is, the more reliable the storage area is and accordingly the more suitable the storage area is for storing data/files with higher importance. In this manner, the reliabilities of storage areas in the flash memory can be predicted in advance, so that the data/files with higher importance can be stored in a storage area having higher reliability. The method for categorizing data/files according to their importance will be described in detail as follows.

The above categorization can be carried out by the system according to the attributes or file extensions of the data/files, or the categorization may also be carried out by a user. After categorizing the data/files according to their importance, the endurance blocks having different endurance values Endu can be corresponded to data/files importance of different levels according to their importance.

If the categorization is carried out by the system, the data/files related to system operations, for example, system files and hidden files, can be stored in an area having Endu=0, the data files can be stored in an area having Endu=1, the video/audio files can be stored in an area having Endu=2, and backup files are stored in an area having Endu=1.

If the categorization is carried out by a user, important data or video/audio files can be stored in an area having Endu=0, general data or video/audio files can be stored in an area having Endu=1, and data or video/audio files of lower importance can be stored in an area having Endu=3. However, the correspondence between data/files of different level importance and endurance blocks having different endurance values Endu is not particularly limited, and can be determined according to the categorization method adopted by the system or the user.

Figure 3:
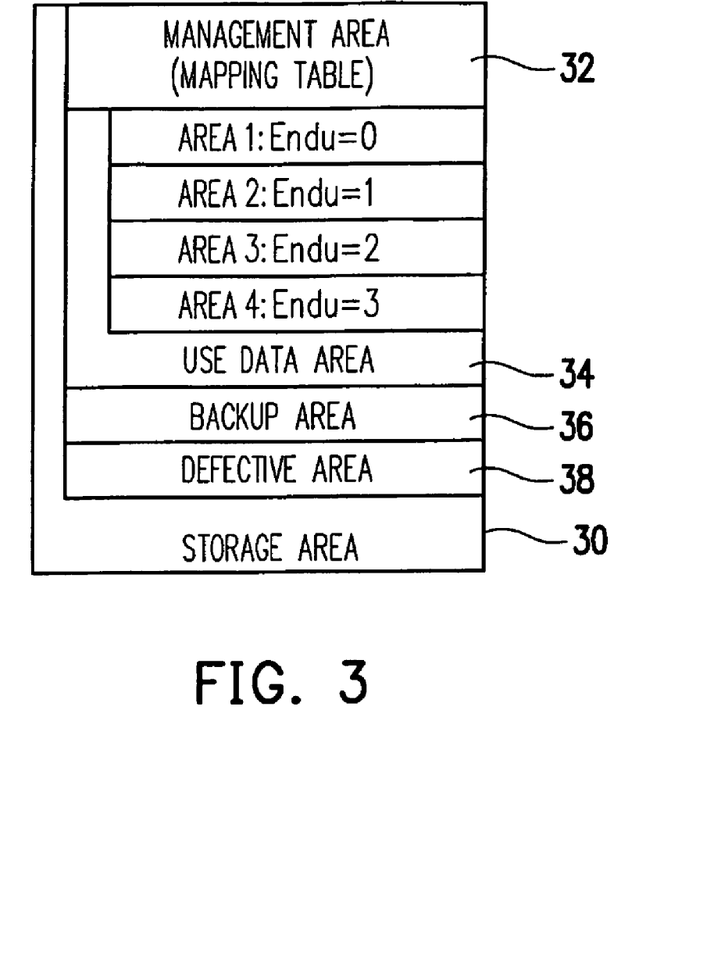
FIG. 3 is a diagram of a storage area in a memory according to one embodiment of the present invention.

FIG. 3 is a diagram of a storage area in a memory according to one embodiment of the present invention. As shown in FIG. 3, n an example of the allocation of a logic storage area in the memory is illustrated. For example, the storage area 30 is divided into a management area (mapping table) 32, a use data area 34, a backup area 36 and a defective area 38. In the present embodiment, the use data area 34 can be further divided into areas 1~4 according to the endurance values Endu, so that data/files can be stored in different areas according to their importance.

Figure 4:
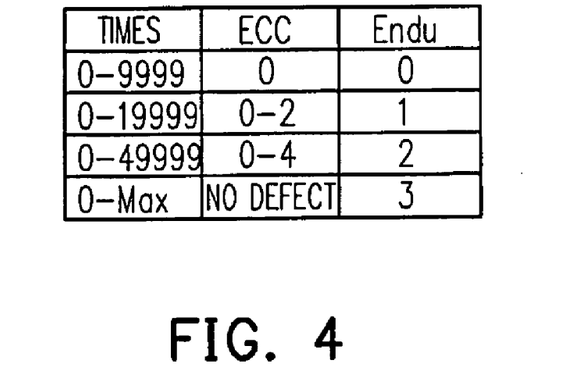
FIG. 4 is a diagram of an endurance table in a management area according to one embodiment of the present invention.

A record table, i.e., endurance table, is stored in the management area 32. The endurance table records the locations of endurance blocks, writing cycles of the endurance blocks, ECC error correction bit numbers and endurance values Endu (indicating). FIG. 4 is a schematic diagram of an endurance table in the management area according to one embodiment of the present invention. Referring to FIG. 4, the endurance value Endu can be a function or a determination formula of a counting number and an ECC. Generally, a flash memory has an E/W reference value (i.e., an erase/write reference value, which refers to how many erasing/writing cycles can be performed to the flash memory) and a distribution (i.e., defect may occur after how many writing cycles) when it is just manufactured. A corresponding function or determination formula can be defined with the E/W reference value, the ECC error correction, and the distribution, so as to calculate the endurance value Endu with the counting number and ECC. The function or determination formula can be revised according to the current memory status and defective status of the flash memory along with the increase of erasing/writing cycles.

A storage area can be divided into a plurality of areas (i.e., the endurance blocks) according to different endurance values Endu in foregoing endurance table. As shown in FIG. 3, the storage area is divided into areas 1~4 according to the endurance values Endu 0~3.

In addition, the function or determination formula corresponding to the endurance values Endu can also be adjusted according to the amount of files of different levels. Moreover, the management area 32 can be implemented with a storage medium of higher reliability, for example, a MRAM, because of the importance of the management area 32.

The structure of data blocks of the flash memory is described as above, and the storage area in the flash memory is allocated according to the endurance values Endu and the importance of the data/files. In addition, in the present embodiment, based on another characteristic, namely, the data movability, of flash memory, the data/files stored in the flash memory can be appropriately moved according to the changes of defective degree of the storage blocks. Thus, important data/files can be always stored in storage areas with higher reliability, so as to prevent the data/files from being lost or damaged. This process will be described below.

Figure 5:
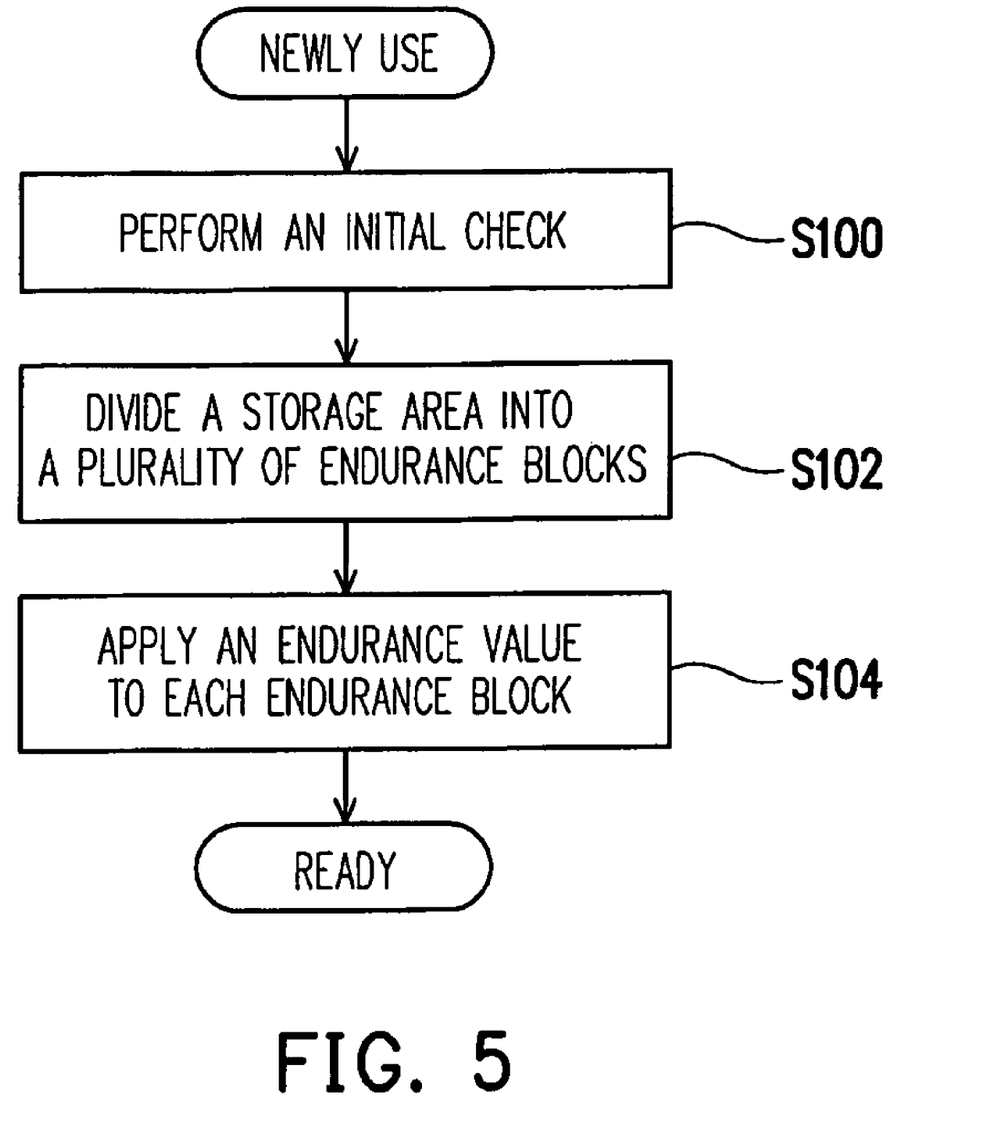
FIG. 5 is a flowchart of a defect management method according to one embodiment of the present invention.

FIG. 5 is a flowchart of a defect management method according to an embodiment of the present invention. The process shown in FIG. 5 is an initial status for use of a memory. First, in step S100, an initial check is performed. The initial check is a complete check to a storage area in the flash memory for determining whether data blocks have problem or defect. Then, in step S102, the storage area is divided, namely, logic storage areas in the storage area are addressed and allocated as shown in FIG. 3. Next, in step S104, the initial endurance blocks are assigned, for example, the areas 1~4 corresponding to endurance values 0~3 as shown in FIG. 3. Because the data blocks of the memory have not been used yet, the endurance blocks can be simply and linearly assigned according to space requirement.

Thereafter, the endurance value Endu of each endurance block is recalculated based on the erase/write and the read operations every time. Then, the data is moved among different endurance blocks according to the recalculated endurance values Endu. The calculation of the endurance values Endu will be described in detail as follows.

Figure 6:
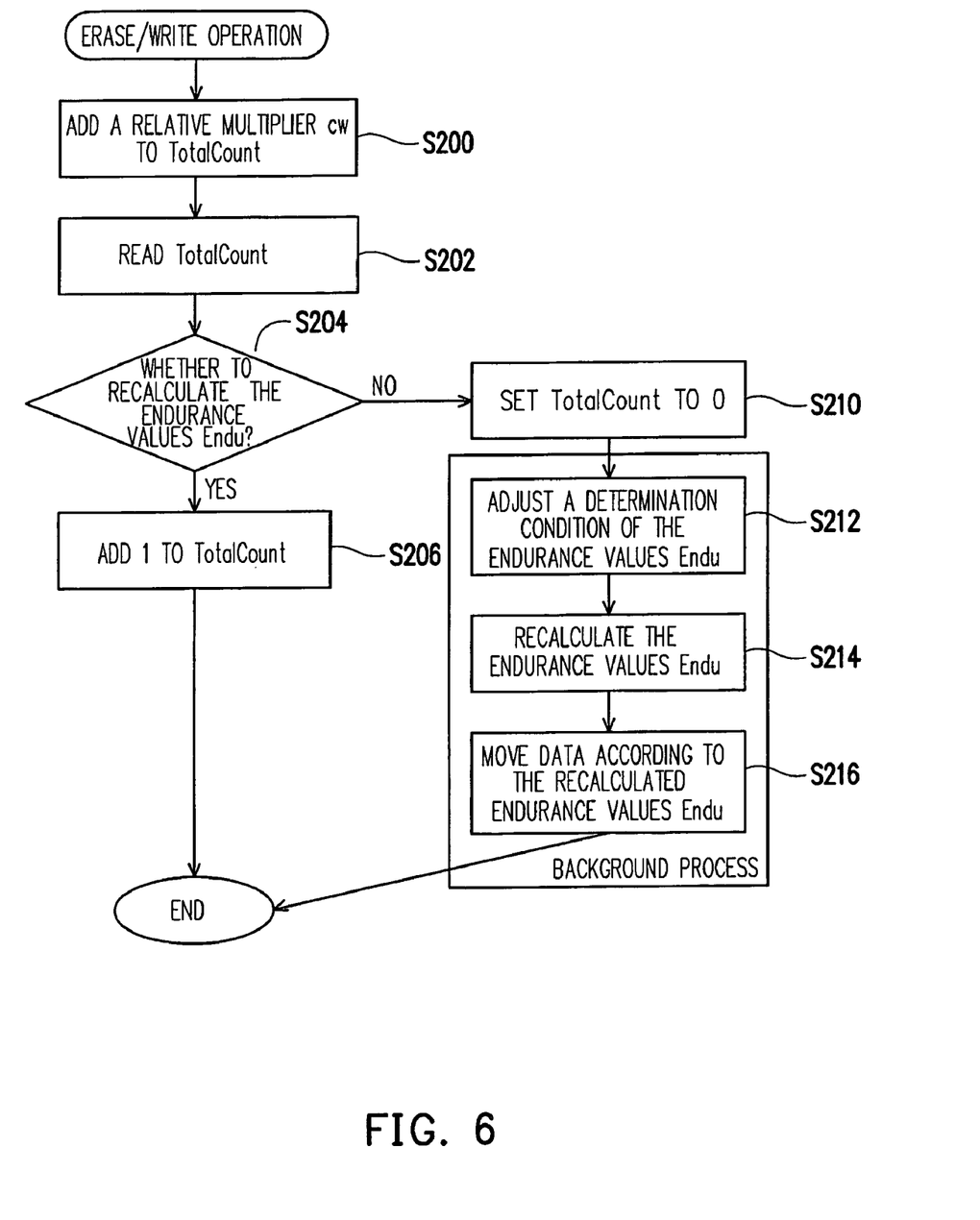
FIG. 6 is a flowchart of a data erase/write operation according to one embodiment of the present invention.

FIG. 6 schematically shows a flowchart of an erase/write operation according to one embodiment of the present invention. First, in step S200, a relative multiplier cw is added to an erase/write total count TotalCount, namely, TotalCount=TotalCount+cw. The erase/write total count TotalCount is recorded, namely, the total number of operations is calculated, while performing an erase/write operation or a read operation to the flash memory. Since the flash memory has a limited life cycle, the degree to be damaged (endurance) of the current recording block can be determined according to the times of operations. In addition, since there is a ration between the damages caused by the erase/write operation and the read operation to the memory, a reference value relative to the reading operation (i.e., the above relative multiplier cw) has to be added while calculating the total number of erase/write operations, so as to make the determination criterion more accurate. The relative multiplier cw added to the erase/write total count TotalCount at every erase/write operation is determined according to a damage ratio of read and write operations. For example, if the life cycle of the erase/write operations of the flash memory is 100,000 times, and the life cycle of reading the flash memory is 100,000,000 times, then the relative multiplier is 1000. As a result, the relative multiplier 1000 is added to the erase/write total count TotalCount when the erase/write operation is performed every time.

Next, in step S202, the erase/write total count TotalCount obtained in step S200 is read. In step S204, whether the endurance values Endu is needed to be recalculated is determined according to the erase/write total count TotalCount read in step S202. Usually, the endurance values Endu in the endurance table are recalculated when the erase/write total count TotalCount reaches a predetermined value.

In step S204, if the erase/write total count TotalCount does not reach the predetermined value, namely, the endurance values Endu are not required to recalculate, the erase/write total count TotalCount is increased by 1 and the erase/write operation is terminated. Otherwise, when the endurance values Endu is needed to be recalculated, the erase/write total count TotalCount is set to 0 in step S210, and steps S212~S216 are executed to recalculate the endurance values Endu. Preferably, the process for recalculating the endurance values Endu is a background process or a process of lower priority.

In the process for recalculating the endurance values Endu, first, in step S210, the erase/write total count TotalCount is set to 0. Next, a determination condition of the endurance values Endu is adjusted. The degree to be damaged of the flash memory is changed along with the increases in erasing/writing cycles and reading cycles. Thus, while recalculating the endurance values Endu, the determination condition (as shown in FIG. 4) of the endurance values Endu has to be adjusted appropriately as in step S212. After that, the endurance values Endu are recalculated according to the new determination condition of the endurance values Endu. In other words, the endurance values Endu of areas 1~4 in FIG. 3 are recalculated. For example, the endurance value of area 1 is 3, the endurance value of area 2 is 1, the endurance value of area 3 is 2, and the endurance value of area 4 is 0. Finally, the data is moved to a storage area having a corresponding endurance value according to the recalculated endurance values Endu, and after that, the erase/write operation is terminated.

Figure 7:
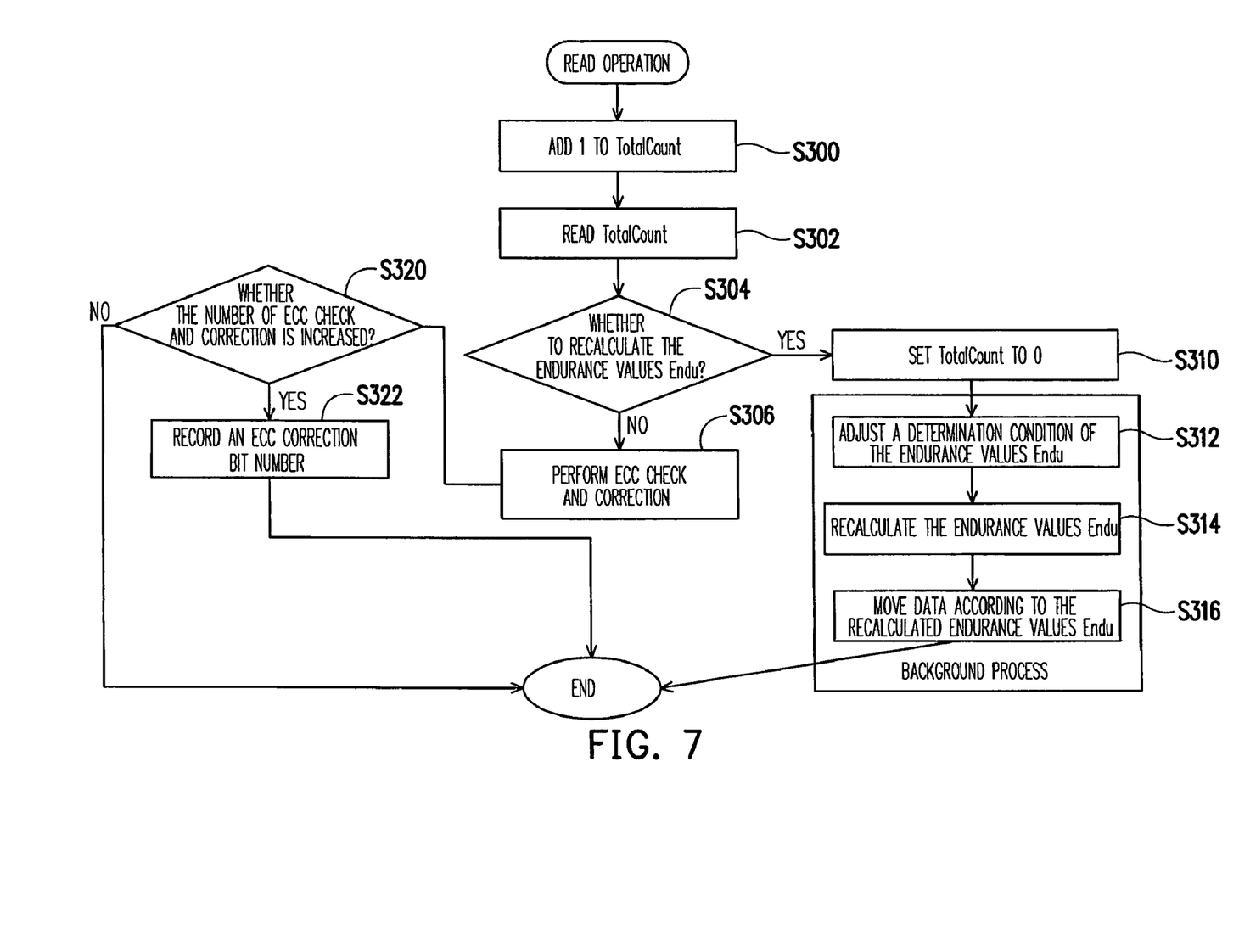
FIG. 7 is a flowchart of a data read operation according to an embodiment of the present invention.

FIG. 7 is a flowchart of a data read operation according to one embodiment of the present invention. A similar process as illustrated in FIG. 6 is performed while reading a flash memory. As shown in FIG. 7, first, in step S300, the read total count TotalCount is increased by 1. Next, in step S302, the read total count TotalCount obtained in step S300 is read. After that, in step S304, whether the endurance values Endu is needed to be recalculated is determined according to the read total count TotalCount read in step S302. Generally, the endurance values Endu in the endurance table are recalculated when the read total count TotalCount reaches a predetermined value.

If the read total count TotalCount does not reach the predetermined value, the endurance values Endu are not recalculated, and in step S304, an ECC check and correction is performed. While reading a memory, an ECC check and correction is usually performed to ensure that correct data is read. However, the number of ECC detections and corrections performed to a data block is also limited and accordingly also affects the endurance of the data block, thus, the number of ECC detections and corrections performed to the data block also has to be recorded (as shown in FIG. 4).

Accordingly, after step S304, whether the number of ECC check and correction is increased (step S320). If so, an ECC correction bit number is recorded in the endurance table as illustrated in FIG. 4 (step S322) and the read operation is terminated. Otherwise, if the number of the ECC detection and correction is not increased in step S320, the read operation is directly terminated.

Additionally, in step S304, if the read total count TotalCount reaches the predetermined value, which means the endurance values Endu is needed to be recalculated, then in step S310, the read total count TotalCount is set to 0, and steps S312~S316 are executed to recalculate the endurance values Endu. Preferably, the process for recalculating the endurance values Endu is a background process or a process of lower priority.

The process for recalculating the endurance values Endu is similar to that illustrated in FIG. 6. First, in step S310, the read total count TotalCount is set to 0, and then a determination condition of the endurance values Endu is adjusted. The determination condition of the endurance values Endu is needed to be adjusted appropriately as in step S312 while recalculating the endurance values Endu.

After that, the endurance values Endu are recalculated according to the adjusted determination condition. In other words, the endurance values of areas 1~4 in FIG. 3 are recalculated. Finally, the data is moved to a storage area having a corresponding endurance value according to the recalculated endurance values Endu, and after that, the read operation is terminated.

In addition, the ECC detection and correction in step S304 can be performed before or after determining whether the endurance values Endu is needed to be recalculated. If a new ECC correction is produced, the new ECC correction is recorded into the endurance table.

As described above, the categorization of data/files according to their importance can be achieved through foregoing initial process, erase/write operation, and read operation for calculating the endurance values Endu. In addition, various values in foregoing procedures can be adjusted in different application. For example, if a data block is left idle for a long time, the total count TotalCount can be reset every 1000 times, and the relative multiplier cw can be set to 10. In addition, these values may also be determined according to the frequency of data access.

Figure 8:
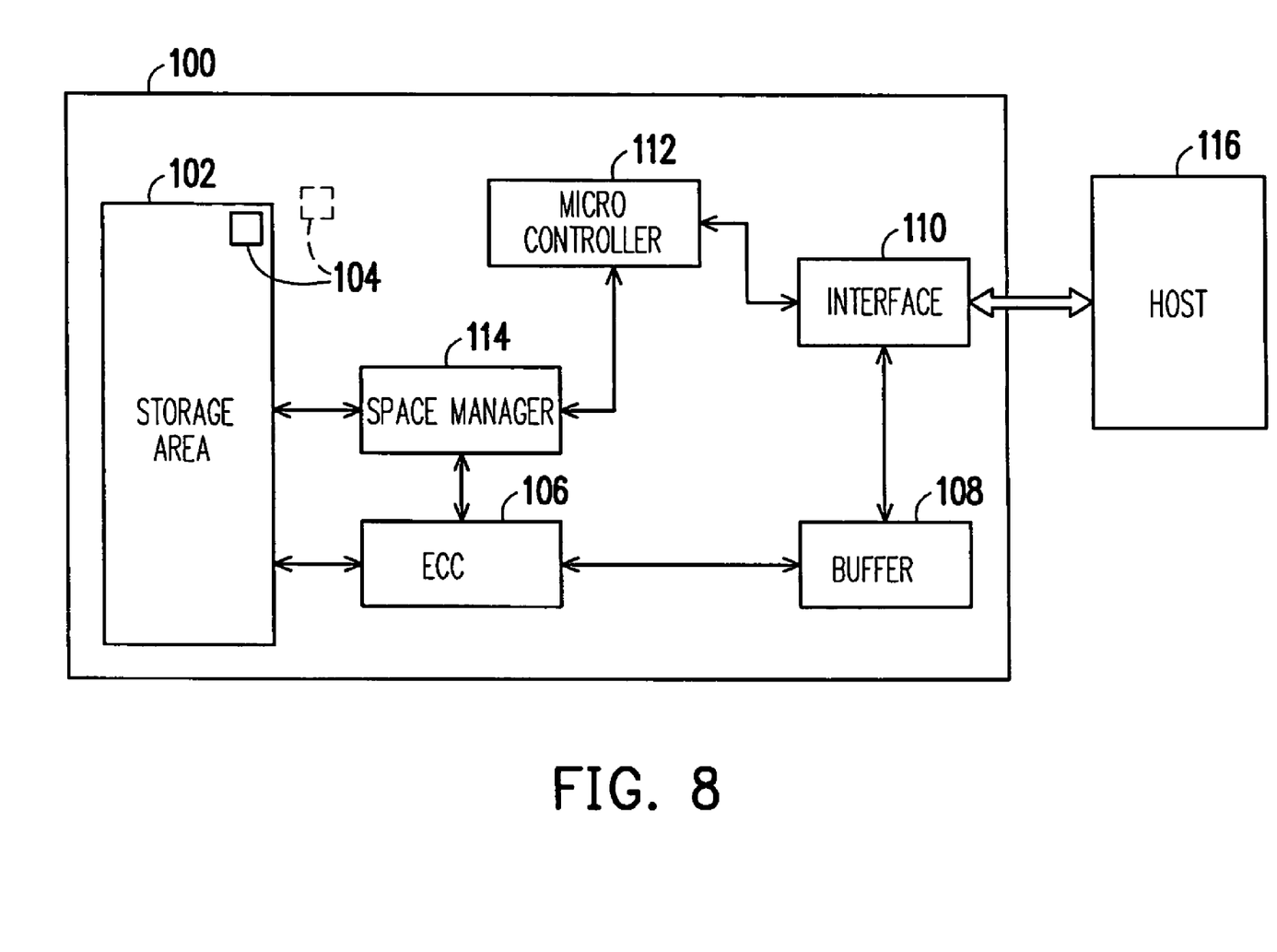
FIG. 8 illustrates the hardware architecture of a defect management system according to one embodiment of the present invention.

A hardware architecture for implementing foregoing method will be described as follows. FIG. 8 illustrates the hardware architecture of a defect management system according to one embodiment of the present invention. Referring to FIG. 8, the storage medium (a flash memory in the present embodiment) 100 includes a storage area 102, an ECC unit 106, a space manager 114, a micro controller 112, an interface 110, a buffer 108, and an endurance table 104.

The storage area 102 is mainly a physical storage area. The ECC unit 106 performs an ECC check and correction process to data to be written into or read from the storage area. The space manager 114 performs address management, allocation and configuration for the storage area. The micro controller 112 controls the entire flash memory 100. The flash memory 100 can communicate with a host (for example, a computer) 116 through the interface 110. The data to be read from or written into the storage area is stored in a register first, and then transmitted between the host 116 and the flash memory 100 through the interface 110. The endurance table 104 stores data as illustrated in FIG. 4, and can be stored in or out of the storage area 102.

The micro controller 112 executes the processes illustrated in FIGS. 5~7 in order to control the space manager 114. Accordingly, the endurance table as illustrated in FIG. 4 is established, and records the corresponding relationship between endurance blocks, writing cycles, ECC correction bit numbers, and endurance values. The micro controller 112 stores important data/files into data blocks with higher endurance values according to the importance of the data/files.

Moreover, the endurances of the data blocks can be recalculated at different stages while performing an erase/write operation or a read operation to the flash memory. After that, the data is moved appropriately according to the recalculated endurance values.

In summary, according to the present invention, data of different importance can be moved appropriately according to the endurances of data blocks. Accordingly, the endurance of a storage medium can be managed effectively through the method and system provided by the present invention.

A flash memory is described in foregoing embodiments as an example. However, the present invention may also be applied to other storage media, and the method and system provided by the present invention can be revised appropriately to be adapted to the characteristics of different storage media.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A defect management method for a storage medium, comprising:
   performing an initial check to the storage medium, and dividing the storage medium into a plurality of areas, wherein the areas comprise at least one use data area having a plurality of endurance blocks, a management area, and a backup area;
   applying an endurance value to each of the endurance blocks in the use data area, wherein each of the endurance value represents a damage degree of the applied endurance block;
   establishing an endurance table in the storage medium, wherein the endurance table records the endurance blocks and the endurance values;
   dividing the use data area into a plurality of second areas, wherein each of the second areas comprises the endurance blocks having the same endurance value;
   storing first data into one of the second areas according to an importance of the first data and the endurance values; and
   performing an erase/write operation to the storage medium according to the endurance table, wherein the endurance values of the endurance blocks are recalculated and the endurance table is updated when the storage medium has been erased/written for predetermined erase/write times, or performing a read operation to the storage medium, wherein the endurance values of the endurance blocks are recalculated and the endurance table is updated when the storage medium has been read for predetermined read times,
   wherein the endurance values of the endurance blocks are recalculated according to a writing cycle and an ECC (error correction code) correction bit number of each of the endurance blocks.

2. The defect management method according to claim 1, wherein the erase/write operation further comprises:
   adding a relative multiplier to an erase/write total count, and determining whether the predetermined erase/write times are reached;
   recalculating the endurance values, moving data according to the recalculated endurance values and terminating the erase/write operation when the predetermined erase/write times are reached; and
   adding 1 to the erase/write total count and terminating the erase/write operation when the predetermined erase/write times are not reached.

3. The defect management method according to claim 2, wherein recalculating the endurance values further comprises:
   setting the erase/write total count to 0;
   adjusting an endurance value determination condition;
   recalculating the endurance values according to the endurance value determination condition; and
   moving data according to the recalculated endurance values.

4. The defect management method according to claim 1, wherein the read operation further comprises:
   adding 1 to a read total count and determining whether the predetermined read times are reached;
   recalculating the endurance values, moving data according to the recalculated endurance values, and terminating the read operation when the predetermined read times are reached; and performing an error correction code (ECC) check and correction procedure and terminating the read operation when the predetermined read times are not reached.

5. The defect management method according to claim 4, wherein recalculating the endurance values further comprises:
setting the read total count to 0;
adjusting an endurance value determination condition;
recalculating the endurance values according to the endurance value determination condition; and
moving data according to the recalculated endurance values.

6. The defect management method according to claim 4, wherein the ECC check and correction procedure further comprises:
determining whether ECC correction times are increased;
recording the ECC correction bit number into the endurance table and terminating the read operation when the ECC correction times are increased; and
terminating the read operation when the ECC correction times are not increased.

7. The defect management method according to claim 1, wherein each of the endurance blocks further comprises a plurality of data blocks, and each of the data blocks comprises an ECC data unit.

8. The defect management method according to claim 1, wherein the endurance table records the endurance blocks, the writing cycles, the ECC correction bit numbers, and the endurance values.

9. The defect management method according to claim 1, wherein the storage medium is a non-volatile memory.

10. The defect management method according to claim 1, wherein the non-volatile memory is a flash memory.

11. A defect management system for a storage medium, comprising:
a storage area, comprising at least a plurality of endurance blocks;
a space manager, coupled to the storage area for managing the storage area;
an ECC unit, coupled to the storage area and the space manager, the ECC unit performing an ECC detection and correction when an erase/write operation or a read operation is performed to the storage area; and
a micro controller, coupled to the space manager, the micro controller executing a defect management procedure, wherein the defect management procedure comprises:
performing an initial check to the storage medium, and dividing the endurance blocks of the storage medium into a plurality of areas, wherein the areas comprise at least one use data area, a management area, and a backup area;
applying an endurance value to each of the endurance blocks in the use data area, wherein each of the endurance value represents a damage degree of the applied endurance block;
establishing an endurance table in the storage medium, wherein the endurance table records the endurance blocks and the endurance values;
dividing the use data area into a plurality of second areas, wherein each of the second areas comprises the endurance blocks having the same endurance value;
storing first data into one of the endurance areas according to an importance of the first data and the endurance values; and
performing an erase/write operation to the storage medium according to the endurance table, wherein the endurance values of the endurance blocks are recalculated and the endurance table is updated when the storage medium has been erased/written for predetermined erase/write times, or performing a read operation to the storage medium, wherein the endurance values of the endurance blocks are recalculated and the endurance table is updated when the storage medium has been read for predetermined read times,
wherein the endurance values of the endurance blocks are recalculated according to a writing cycle and an ECC (error correction code) correction bit number of each of the endurance blocks.

12. The defect management system according to claim 11, wherein each of the endurance blocks comprises a plurality of data blocks, and each of the data blocks further comprises a plurality of ECC data units.

13. The defect management system according to claim 11, wherein the endurance table is established in or out of the storage area.

14. The defect management system according to claim 11, wherein the endurance table records the endurance blocks, the writing cycles, the ECC correction bit numbers, and the endurance values.

15. The defect management system according to claim 11, wherein the storage medium is a non-volatile memory.

16. The defect management system according to claim 11, wherein the non-volatile memory is a flash memory.

17. The defect management system according to claim 11 further comprising an interface, wherein an external host and the micro controller communicate through the interface.

18. The defect management system according to claim 11 further comprising a buffer coupled between the interface and the ECC unit.

* * * * *